(12) United States Patent
Hsu

(10) Patent No.: US 6,919,621 B2
(45) Date of Patent: Jul. 19, 2005

(54) BONDING PAD DESIGN FOR IMPEDANCE MATCHING IMPROVEMENT

(75) Inventor: Jimmy Hsu, Taipei (TW)

(73) Assignee: Via Technologies, Inc., Taipei (TW)

( * ) Notice: Subject to any disclaimer, the term of this patent is extended or adjusted under 35 U.S.C. 154(b) by 0 days.

(21) Appl. No.: 10/705,978

(22) Filed: Nov. 13, 2003

(65) Prior Publication Data

US 2005/0051897 A1 Mar. 10, 2005

(30) Foreign Application Priority Data

Sep. 5, 2003 (TW) ......................... 92124532 A

(51) Int. Cl.⁷ .......................................... H01L 23/495
(52) U.S. Cl. ...................................... 257/666; 257/758
(58) Field of Search ................................ 257/705, 706, 257/712, 713, 717, 723, 666, 720, 758, 759, 673

(56) References Cited

U.S. PATENT DOCUMENTS 5,904,499 A * 5/1999 Pace .......................... 438/108
6,147,857 A * 11/2000 Worley et al. ............ 361/301.2
6,282,095 B1 * 8/2001 Houghton et al. .......... 361/704
6,486,549 B1 * 11/2002 Chiang ....................... 257/723
6,703,656 B2 * 3/2004 Keeth et al. ................ 257/296

* cited by examiner

Primary Examiner—Howard Weiss
Assistant Examiner—(Vikki) Hoa B. Trinh
(74) Attorney, Agent, or Firm—Troxell Law Office, PLLC

(57) ABSTRACT

The present invention is a bonding pad structure for improving impedance matching that can optimize the impedance matching of the loop between the chip and the substrate inside the package so as to improve the electrical characteristics of the package structure by increasing the capacitance of the loop through a simple structural refinement of the bonding pad structure. The aforesaid bonding pad structure has function of signal transmission and grounding for electronic components having multiple electrical-connected layers, furthermore, the feature of the foregoing structure is as following: the space between two bonding pads exists a metal structure constructed using a plurality of parallel-positioned metal layers which are overlapping and disconnected to one another.

8 Claims, 7 Drawing Sheets

| type | 2.4GHz | | 5GHz | |
|---|---|---|---|---|
| | S11(dB) | S21(dB) | S11(dB) | S21(dB) |
| Before | −16.70 | −0.18 | −10.24 | −0.57 |
| After | −24.29 | −0.11 | −13.24 | −0.33 |

FIG. 5

BONDING PAD DESIGN FOR IMPEDANCE MATCHING IMPROVEMENT

BACKGROUND OF THE INVENTION (a). Field of the Invention

The present invention relates to a bonding pad structure, more particularly, to a bonding pad structure for improving impedance matching.

(b). Description of the Prior Arts

Along with the retirement of the outdated electronic products, the operating frequency of the newer generation electronic products are gradually become higher and higher so as to fulfill the demands of the consumers. For instance, the operating frequency of a package structure corresponding to a radio-frequency (RF) circuit or high-speed circuit commonly will be employed in GHz range.

Thus, the package structure corresponding to the electronic product having high operating frequency is required to have better electrical characteristics so as to stabilize the high-frequency electronic product while functioning. Please refer to FIG. 1, which is a cross-sectional view depicting a package structure of a RF circuit. In the package structure 100 as seen in FIG. 1, the signal transmitted between the chip 110 and the substrate 127 is accomplished using the longer metal wire 125 to couple the chip 110 with a lead located on the substrate 127. On the other hand, part of the grounding of the signal between the chip 110 and the substrate 127 is accomplished using the shorter metal wire 120 to couple the chip 110 directly with the chip-carrying die pad 130 located on the substrate 127 so that a shorter signal loop between the chip 110 and the substrate 127 can be achieved for enabling the package structure 100 to have better electrical characteristics and heat-flux capability.

However, in the aforesaid high-frequency package structure 100, the total area between the chip 110 and the substrate 127 defined using the loop corresponding to the longer metal wire 125 and the shorter metal wire 120 is still too large that the electrical characteristics of the package structure 100 will show high inductance and high impedance, moreover, while the package structure 100 is operating in high frequency, a sever signal reflection will occur because of the impedance mismatching between the forgoing loop, also the return loss of the loop is decreased.

For improving the electrical characteristics of the high-frequency package structure 100, that is, enabling the loop between the chip 110 and the substrate 127 to have both matching inductance and matching capacitance, or to have a better-matched return loss and insertion loss, the prior art normally will install a NMOS transistor or a PMOS transistor inside the chip 110 of the package structure 100 as a voltage-stabilizing capacitor. Nevertheless, the installation of the NMOS transistor or the PMOS transistor had confined the signal bandwidth and the accuracy of the package structure to haven many other applications.

In addition, for further bettering the electrical characteristics of the high-frequency package structure 100, the Metal-Insulator-Metal (MIM) process is used for installing the aforesaid NMOS transistor or PMOS transistor inside the chip 110 of the package structure 100. However, the cost of the MIM process is too high to be commonly implemented.

The present invention is a bonding pad structure for improving impedance matching that can optimize the impedance matching of the loop between the chip and the substrate inside the package so as to improve the electrical characteristics of the package structure by increasing the capacitance of the loop through a simple structural refinement of the bonding pad structure.

SUMMARY OF THE INVENTION

The primary object of the present invention is to provide a bonding pad structure for improving impedance matching. The aforesaid bonding pad structure is used in an electronic component having multiple electrical-connected layers for signal transmission and grounding, furthermore, the signature of the foregoing structure is as following: the space between two bonding pads exists a metal structure constructed using a plurality of parallel-positioned metal plates which are overlapping and disconnected to one another.

The aforesaid two bonding pads is neighbored to each other and is buried inside an electronic component from the surface thereof into a depth of its interior, wherein, the two bonding pads respectively comprise, successively from the electronic component's surface to the interior thereof, a plurality of metal plates and a plurality of plugs that are successively superimposed to one another, moreover, the amount and the order of the plates and the plugs are depended on the designing requirement. Further, the two neighboring bonding pads respectively should have at least a metal plate parallel extending toward the neighboring bonding pad, and superimposing a portion of the metal plate of its neighboring bonding pad, also the two metal plates is positioned apart from each other with a distance.

In an embodiment of the present invention, the bonding pad structure that can improve impedance matching is applied in the package structure of high-frequency circuit. Thus, the aforementioned electronic component can be a chip or a multi-layer printed circuit board.

In a preferred embodiment of the present invention, the bonding pad structure buried inside a chip comprises three bonding pads, which are first bonding pad, second bonding pad, and third bonding pad. All of the three bonding pads comprise respectively three plugs and three metal plates, wherein, on one side of the second bonding pad, the metal plates parallel extending toward one another that are successively overlapping one another from top to bottom are: the first metal plate of the first bonding pad, the second metal plate of the second bonding pad, the second metal plate of the first bonding pad, the third metal plate of the second bonding pad, the third metal plate of the first bonding pad, furthermore, similarly on the other side of the second bonding pad, the metal plates from top to bottom are: the first metal plate of the third bonding pad, the second metal plate of the second bonding pad, the second metal plate of the third bonding pad, the third metal plate of the second bonding pad, the third metal plate of the third bonding pad.

To sum up, The present invention is a bonding pad structure for improving impedance matching that can optimize the impedance matching of the loop between the chip and the substrate inside the package so as to improve the electrical characteristics of the package structure by increasing the capacitance of the loop through a simple structural refinement of the bonding pad structure.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiments of the present invention will be readily understood by the accompanying drawings and detailed descriptions, wherein:

FIG. 5 is a reference table showing the return loss and the insertion loss of the package structure shown in FIG. 1 before and after using the bonding pad structure of the present invention.

DETAILED DESCRIPTION OF THE PRESENT INVENTION

In the package structure of the prior art, since the total area between the chip and the substrate defined using the loop corresponding to the metal wires is still too large that the electrical characteristics of the high-frequency package structure will show high inductance and high impedance, moreover, while the package structure is operating in high frequency, a sever signal reflection will occur because of the impedance mismatching between the forgoing loop.

For improving the electrical characteristics of the high-frequency package structure, the prior art normally will install a NMOS transistor or a PMOS transistor inside the chip of the package structure using MIM process. Nevertheless, the installation of the NMOS transistor or the PMOS transistor had confined the signal bandwidth and the accuracy of the package structure to haven many other application, moreover, the cost of the MIM process is too high to be commonly implemented.

Thus, the present invention intends to improve the bonding pad structure constructed inside a chip of a package structure for carrying metal wires in a way that the capacitance of the loop formed between the chip and the substrate inside the package structure can be increased for enhancing the electrical characteristics of the package structure by using the parallel circuit board constructed using the aforesaid parallel extending metal plates of the two neighboring bonding pads that are overlapping and are respectively connected to the multi-layer metal plates structure of the chip.

The following embodiments will illustrate the device and the method for processing the digital image of the present invention in detail.

Figure 2:
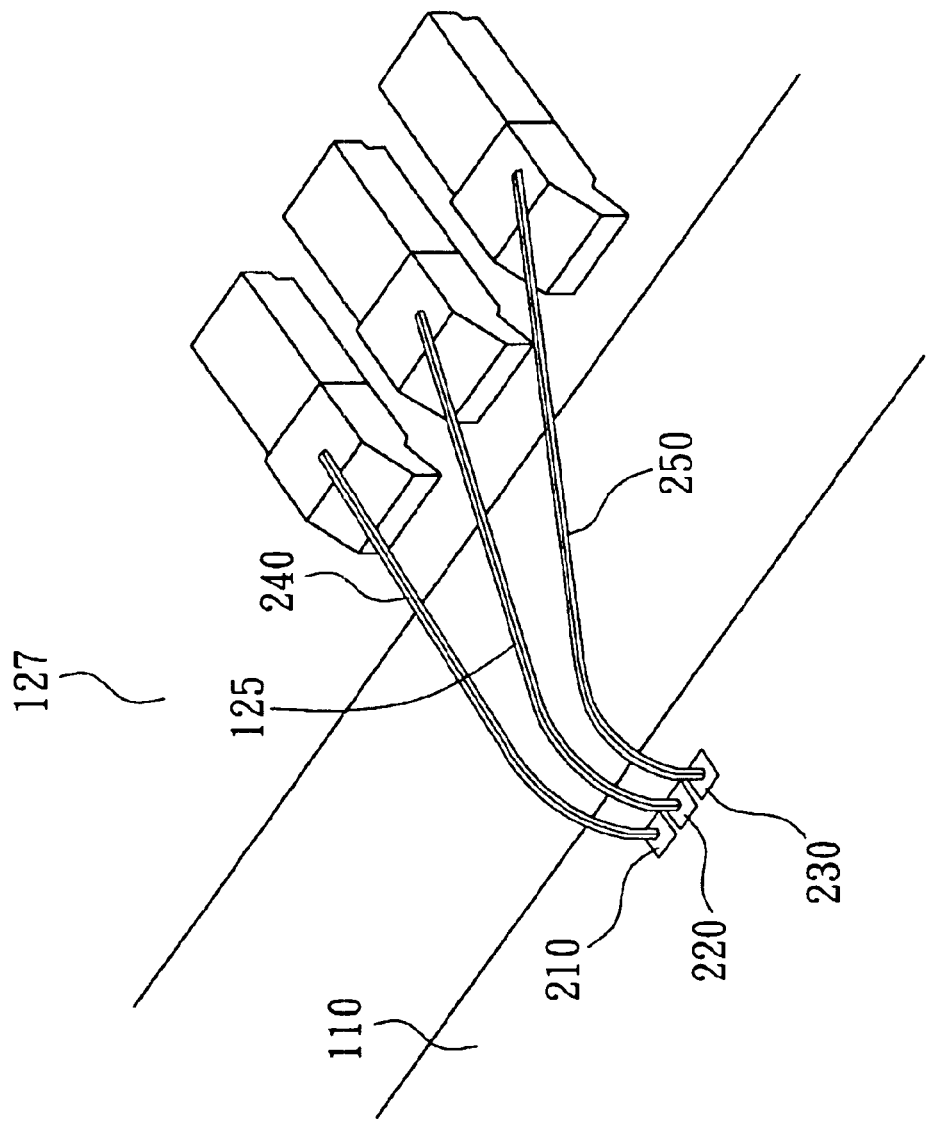
FIG. 2 is a top view showing a bonding pad structure of a preferred embodiment in accordance to the present invention.

Please refer to FIG. 2, which is a top view showing a bonding pad structure of a preferred embodiment in accordance to the present invention. As shown in FIG. 2, a chip 110 comprises three bonding pads 210, 220, and 230, further, metal wires 125, 240 and 250 positioned between the chip 110 and a substrate 127 respectively forms an electrical connection with each metal layer inside the chip 110 by passing through the bonding pads 220, 210, and 230.

Figure 3:
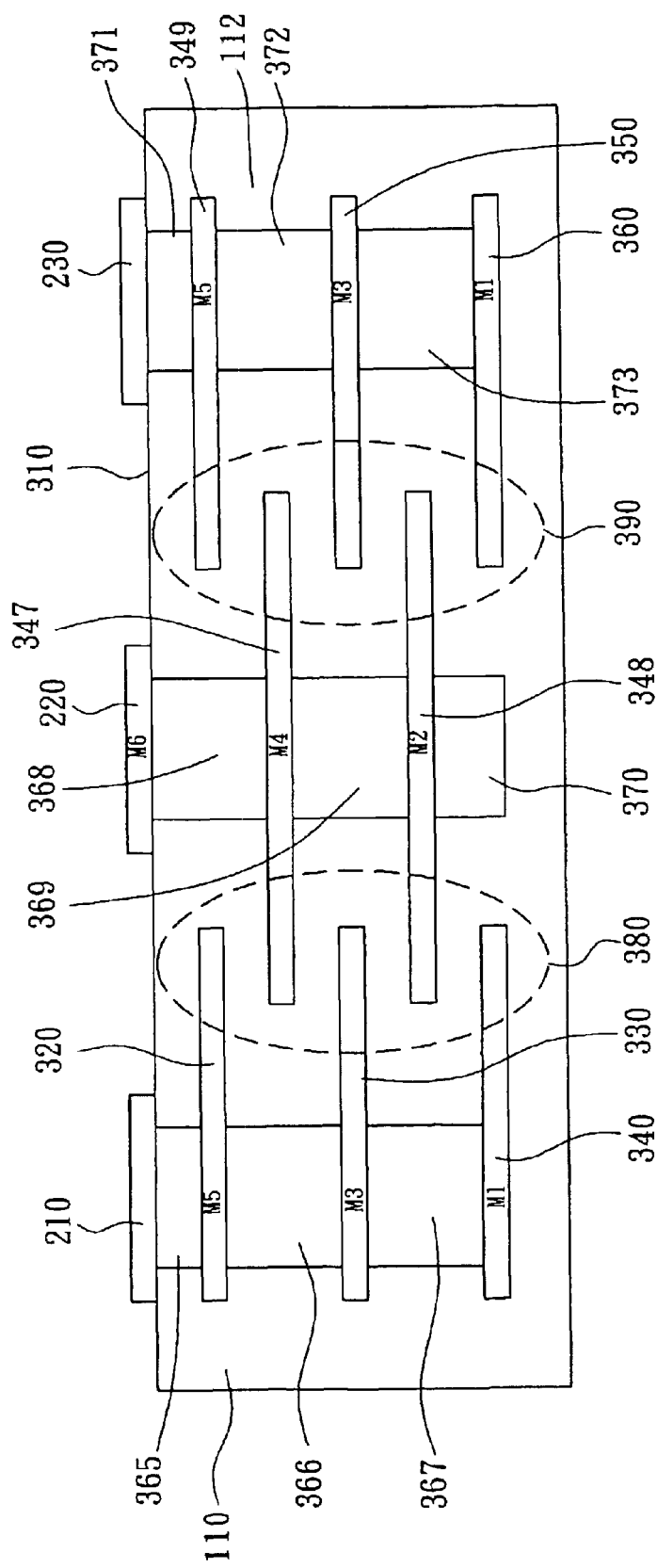
FIG. 3 is a cross-sectional view depicting a bonding pad structure of a preferred embodiment in accordance to the present invention.

Please refer to FIG. 3, which is a cross-sectional view depicting a bonding pad structure of a preferred embodiment in accordance to the present invention. As shown in FIG. 3, the bonding pads 210–230 are neighbored with one another and are buried inside the chip 110 from the surface 310 thereof into a depth of its interior. From the surface 310 of the chip 110 to the interior thereof, the bonding pads 210–230 respectively comprise a plurality of metal plates 320–360 and a plurality of plugs 365–373 that are successively superimposed to one another, moreover, the amount and the order of the plates and the plugs are depended on the amount of metal layers installed in the chip 110 (i.e. 6 layers in the chip 110).

That is, the bonding pad 210 is formed, successively from the surface 310 of the chip 110 to the interior thereof, with a plug 365, a metal plate 320, a plug 366, a metal plate 330, a plug 367 and a metal plate 340. Similarly, the bonding pad 220 is formed with a metal plate 220, a plug 368, a metal plate 347, a plug 369 a metal plate 348 and a plug 370. Similarly, the bonding pad 230 is formed with a plug 371, a metal plate 349, a plug 372, a metal plate 350, a plug 373 and a metal plate 360.

Figure 4:
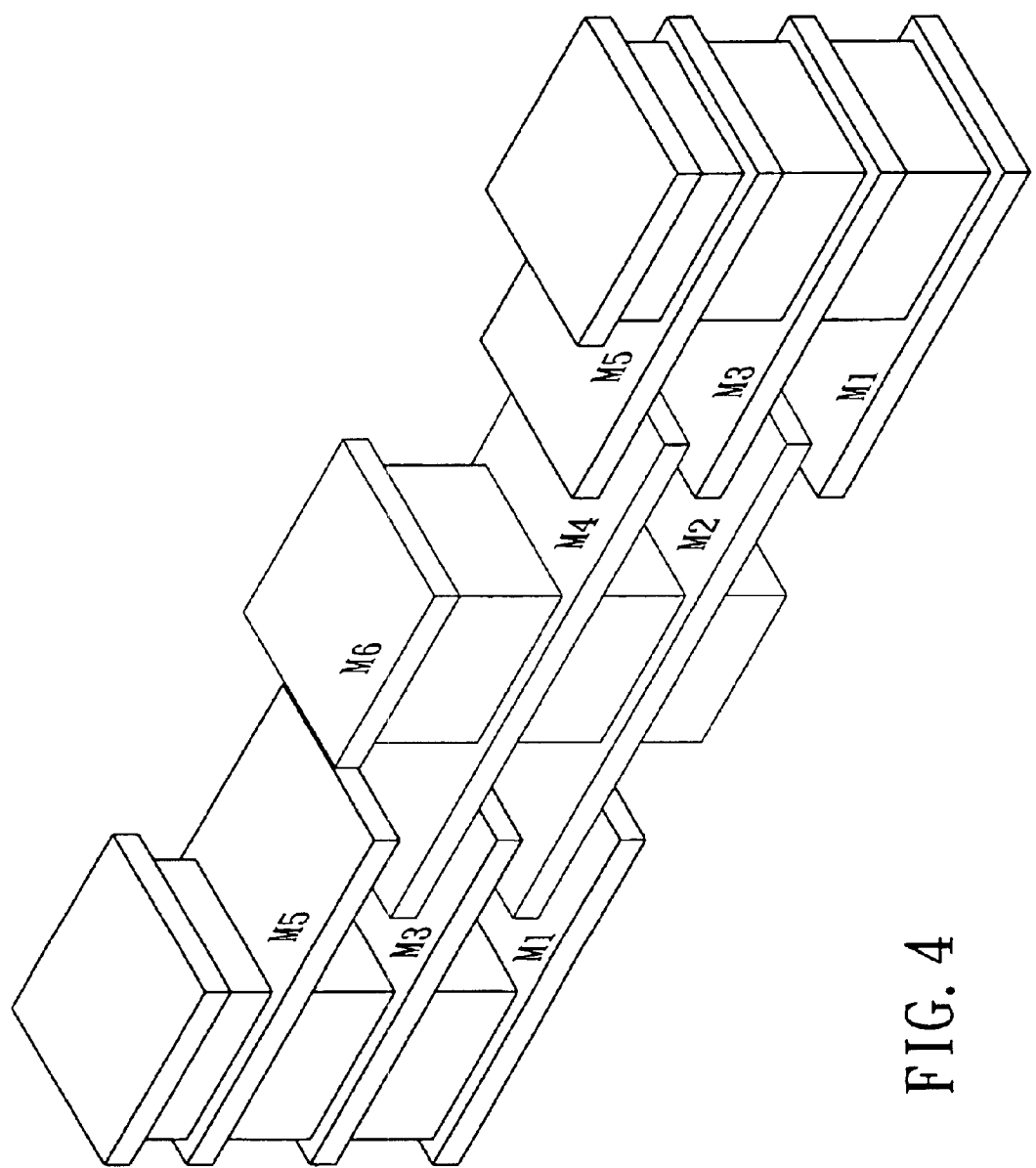
FIG. 4 is a 3-D diagram of FIG. 3.

Furthermore, also referring to FIG. 4, which is a 3-D diagram of FIG. 3, the metal plates 320–340 of the bonding pad 210 respectively are coupled to the fifth metal layer M5, the third metal layer M3 and the first metal layer M1 inside the chip 110. The same time, the metal plates 345–348 of the bonding pad 220 respectively are coupled to the sixth metal layer M6, the fourth metal layer M4 and the second metal layer M2 inside the chip 110. The metal plates 349–360 of the bonding pad 230 respectively are coupled to the fifth metal layer M5, the third metal layer M3 and the first metal layer M1 inside the chip 110.

Wherein, the characteristic of the bonding pad structure 210–230 is that the metal plates 320–340 of the bonding pad 210 and the metal plates 347–348 of the bonding pad 220 are parallel extending toward each other, and a portion thereof are overlapping with one another, also every two intersecting metal plates is positioned apart from each other with a distance d so that a parallel metal plate structure 380 is formed. Thus, as seen in FIG. 3, the parallel metal plate structure 380 between the bonding pads 210 and 220 is constructed successively using the metal plate 320, the metal plate 347, the metal plate 330, the metal plate 348 and the metal plate 340, also the metal structure 380 contains insulation layers 112 in-between metal plates, such as $SiO_2$.

Similarly, the metal plates 347–348 of the bonding pad 220 and the metal plates 349–360 of the bonding pad 230 are parallel extending toward each other, and a portion thereof are overlapping with one another, also every two intersecting metal plates is positioned apart from each other with a distance d so that a parallel metal plate structure 390 is formed. Thus, as seen in FIG. 3, the parallel metal plate structure 390 between the bonding pads 220 and 230 is constructed successively using the metal plate 349, the metal plate 347, the metal plate 350, the metal plate 348 and the metal plate 360.

Since the bonding pad structure comprising the bonding pads 210–230 has the two parallel metal plate structures 380 and 390 existing in-between bonding pads, when the metal plates 320–360 respectively within the bonding pads 210–230 are used by the chip 110 to transmit signals to the metal layers M1–M6 within the chip 110, one who skilled in the art will know that the two parallel metal plate structures 380 and 390 existing in the bonding pad structure 210–230 will increase the capacitance of the loop inside the chip 110.

Figure 1:
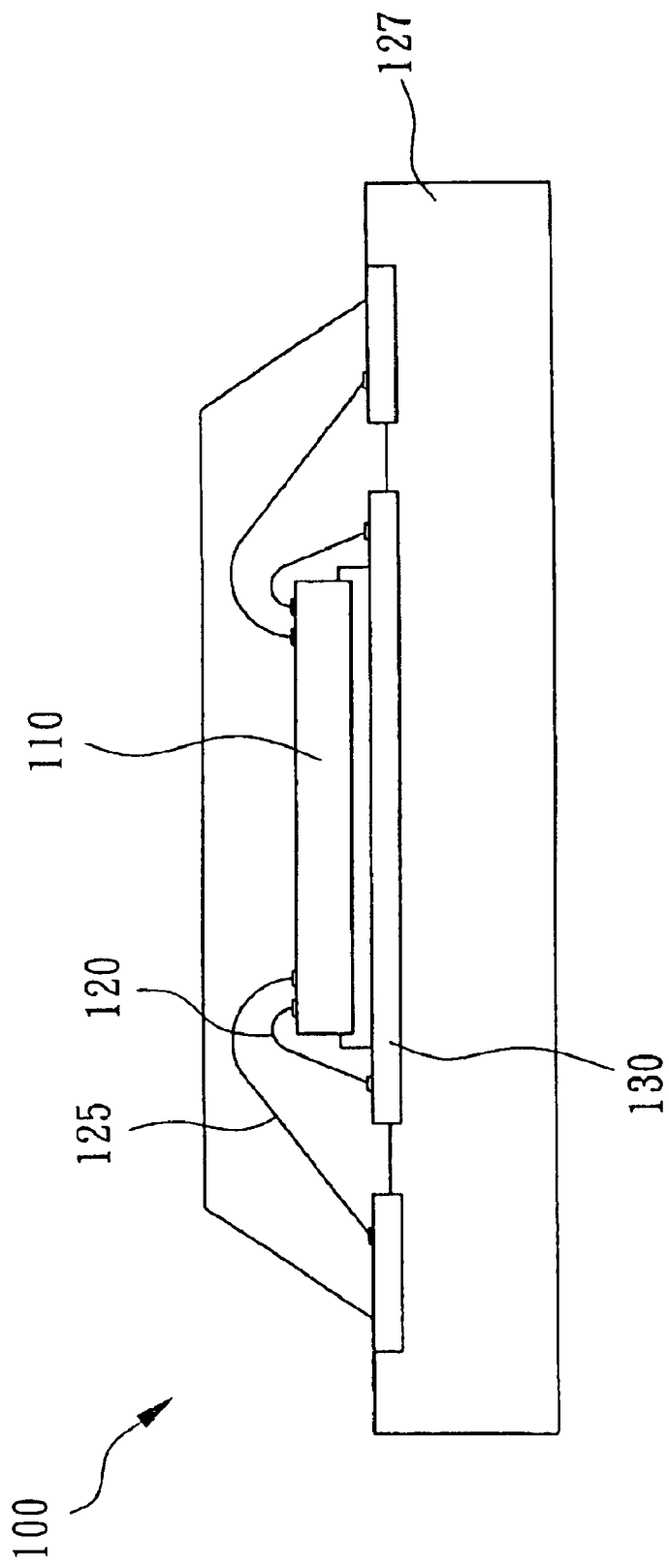
FIG. 1 is a cross-sectional view depicting a package structure of a RF circuit.

Therefore, according to the impedance matching formula of the loop:

$$\text{impedace}(Z) = \sqrt{\text{indutace}(L)/\text{capacitance}(C)}$$

the high inductance of the loop between the chip 110 and the substrate 120 of the package structure 110 with reference to FIG. 1 can be matched by the high capacitance acquired using the bonding pad structure 210–230 of the present invention. That is, the impedance (Z) of the loop between the chip 110 and the substrate 120 can be optimized using the high capacitance of the bond pad structure 210–230 in accordance to the present invention.

Figure 6A:
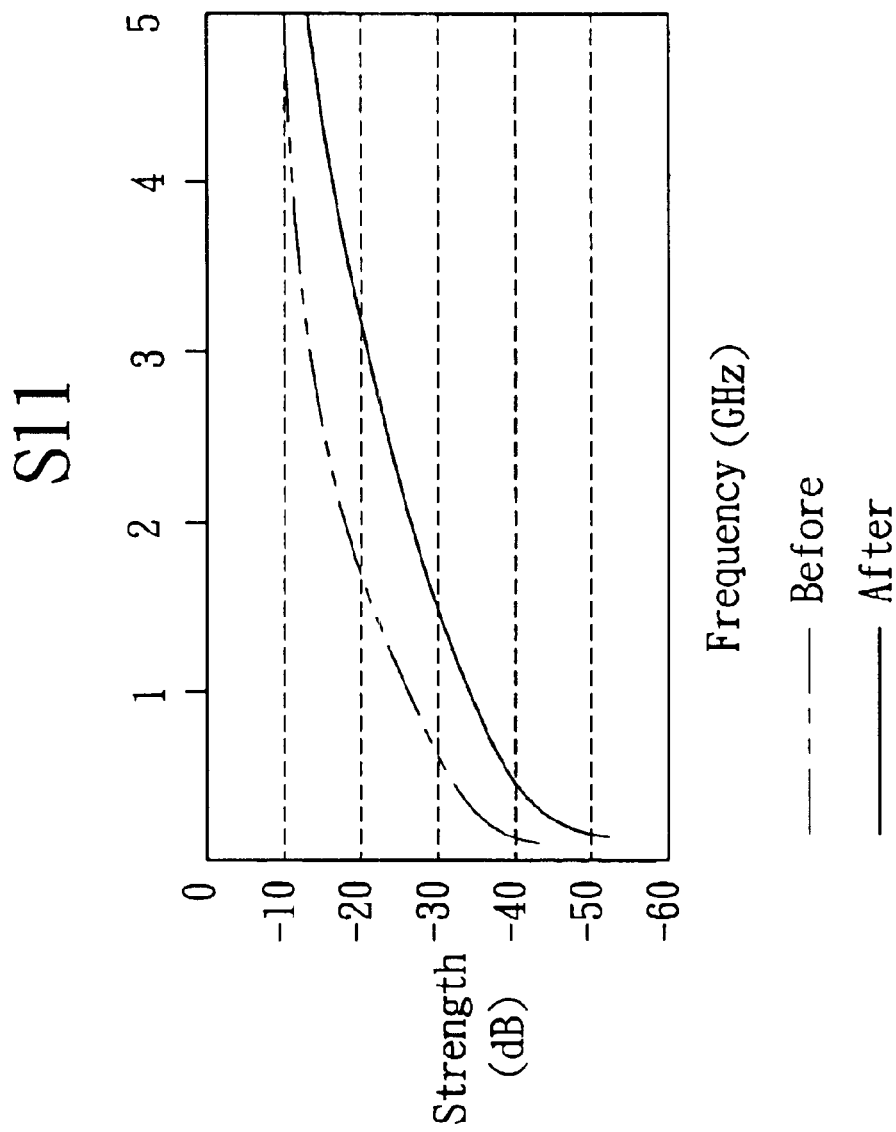
FIG. 6A a reference chart showing the return loss of the package structure shown in FIG. 1 before and after using the bonding pad structure of the present invention.
Figure 6B:
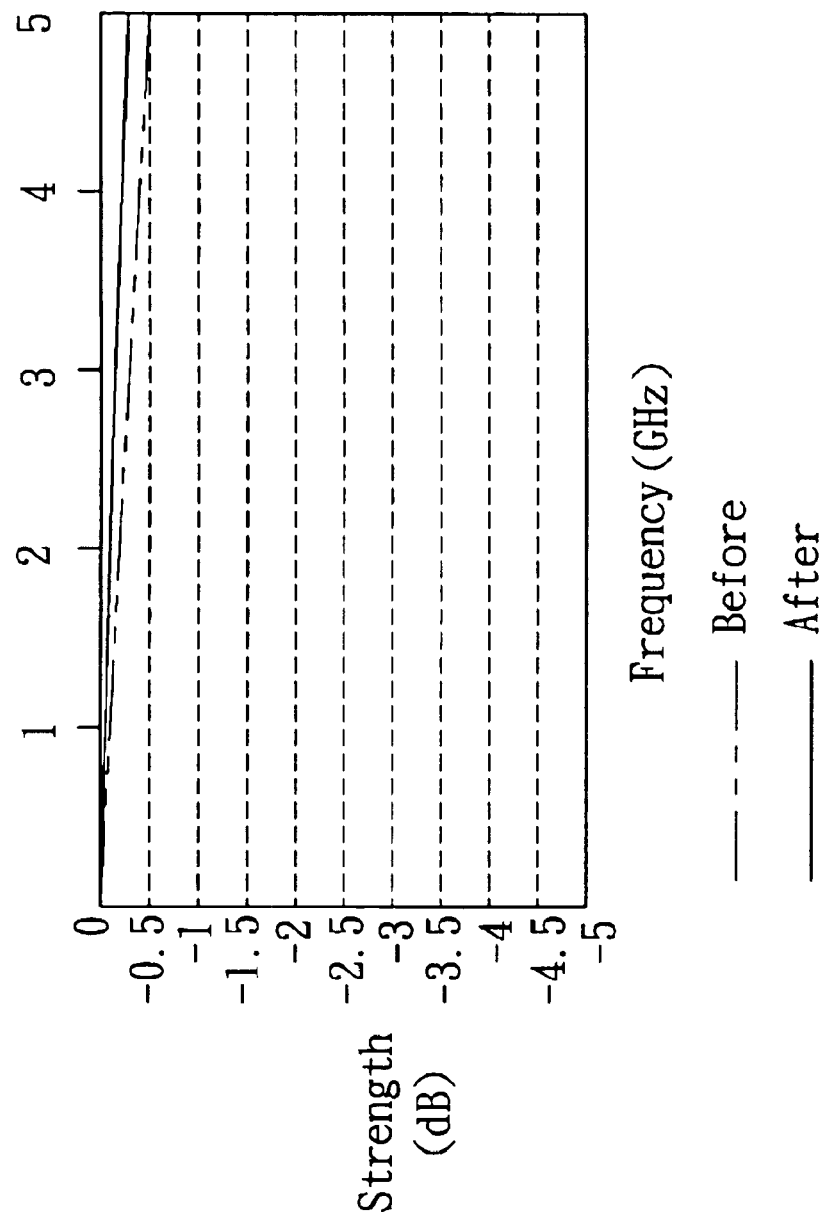
FIG. 6B a reference chart showing the insertion loss of the package structure shown in FIG. 1 before and after using the bonding pad structure of the present invention.

From experiment, when the chip 110 of FIG. 1 uses the bonding pads 210–230 of the present invention, the electrical performance is optimized, that is, the insertion loss and the return loss will approach an optimum value. Please refer to FIG. 5. FIG. 6A and FIG. 6B, which respectively are a reference table, and reference charts showing the insertion loss (S11) and the return loss (S12) of the package structure of FIG. 1 before and after using the bonding pad structure 210–230 of the present invention.

When the bonding pad structure 210–230 is used in the package structure 100, and the operating frequency of the package structure 100 is 2.4 GHz, (S11) of the total loop is –24.29 dB which is 7.59 dB smaller compared to the –16.70 db before the aforesaid bonding pad structure is used, moreover, (S21) of the total loop is –0.11 dB which is 0.07 dB larger compared to the –0.18 db before the aforesaid bonding pad structure is used. Further, when the operating frequency of the package structure 100 is 5 GHz, (S11) of the total loop is –13.24 dB which is 3 dB smaller compared to the –10.24 dB before the aforesaid bonding pad structure is used, moreover, (S21) of the total loop is –0.26 dB which is 0.24 dB larger compared to the –0.50 dB before the aforesaid bonding pad structure is used.

Therefore, the insertion loss of the total loop of the package structure 100 is decreased after using the bonding pad structure 210–230 of the present invention, and the return loss of the total loop of the package structure 100 is increased after using the bonding pad structure 210–230 of the present invention. The decrease of the insertion loss is helpful to the package structure 100 for reducing energy loss and enhancing signal integrity of high-frequency signal. Thus, the distribution of the return loss and the insertion loss of the total loop can be optimized using the bonding pad structure 210–230 of the present invention.

To sum up, the present invention is a bonding pad structure for improving impedance matching. The aforesaid structure can increase the capacitance of the bonding-pad-connecting loop using the parallel metal plates structure constructed using the parallel extending metal plates between the two bonding pads. Hence, when the bonding pad structure of the present invention is used in package design, not only the impedance of the total loop of the package structure can be matched, but also the distribution of the return loss and the insertion loss of the total loop can be optimized so that a better electrical characteristic is achieved.

While the present invention has been shown and described with reference to a preferred embodiment thereof, and in terms of the illustrative drawings, it should be not considered as limited thereby. Various possible modification, omission, and alterations could be conceived of by one skilled in the art to the form and the content of any particular embodiment, without departing from the scope and the sprit of the present invention.

What is claimed is:

1. A bonding pad structure for improving impedance matching, which is used in an electrical device having a plurality of electrically-connected layers for signal transmission and grounding, comprising:

at least two bonding pads including a first bonding pad and a second bonding pad, each of the at least two bonding pads having:

a) at least two plugs; and b) at least two metal layers, wherein, each of the at least two metal layers are electrically connected to and spaced apart by one of the at least two plugs, ends of at least two of the at least two metal layers of the first bonding pad are alternately spaced apart and overlapped with ends at least two of the at least two metal layers of the second bonding pad.

2. The bonding pad structure according to claim 1, wherein each of the at least two plugs and each of that least two metal layers are located in insulation layers of the electrical device.

3. The bonding pad structure according to claim 1, wherein the electronic device is a printed circuit board.

4. The bonding pad structure according to claim 1, wherein the electronic device is a chip.

5. The bonding pad structure according to claim 4, wherein the chip includes six metal layers.

6. The bonding pad structure according to claim 1, wherein the at least two bonding pads includes the first bonding pad, the second bonding pad, and a third bonding pad.

7. The bonding pad structure according to claim 6, wherein each of the first bonding pad, the second bonding pad, and the third bonding pad have three plugs and three metal layers respectively, the first bonding pad has first, third, and fifth metal layers, the second bonding pad has second, fourth, and sixth metal layers, the third bonding pad has first, third, and fifth metal layers, the second metal layer is located above the first metal layer, the third metal layer is located above the second metal layer, the fourth metal layer is located above the third metal layer, the fifth metal layer is located above the fourth metal layer, and the sixth metal layer is located above the fifth metal layer.

8. The bonding pad structure according to claim 6, wherein one end of the first, third, and fifth metal layers of the first bonding pad overlap a first end of the second, and fourth metal layers of the second bonding pad, and one end of the first, third, and fifth metal layers of the third bonding pad overlap a second end of the second, and fourth metal layers of the second bonding pad.

* * * * *